(12) United States Patent
Minami et al.

(10) Patent No.: US 10,201,908 B2
(45) Date of Patent: Feb. 12, 2019

(54) CUTTING TOOL

(71) Applicant: KANEFUSA KABUSHIKI KAISHA, Niwa-gun, Aichi (JP)

(72) Inventors: Toru Minami, Aichi (JP); Yasunari Yamada, Aichi (JP); Satoru Nishio, Aichi (JP)

(73) Assignee: Kanefusa Kabushiki Kaisha, Niwa-gun (JP)

( * ) Notice: Subject to any disclaimer, the term of this patent is extended or adjusted under 35 U.S.C. 154(b) by 292 days.

(21) Appl. No.: 14/443,900

(22) PCT Filed: Nov. 20, 2013

(86) PCT No.: PCT/JP2013/081270
§ 371 (c)(1),
(2) Date: May 19, 2015

(87) PCT Pub. No.: WO2014/103567
PCT Pub. Date: Jul. 3, 2014

(65) Prior Publication Data
US 2015/0273724 A1    Oct. 1, 2015

(30) Foreign Application Priority Data

Dec. 28, 2012 (JP) .................... 2012-287857

(51) Int. Cl.
    B27G 13/00        (2006.01)
    B27B 33/00        (2006.01)
    (Continued)

(52) U.S. Cl.
    CPC ............. B27G 13/00 (2013.01); B23D 61/00 (2013.01); B23D 61/028 (2013.01); B23D 65/00 (2013.01);
    (Continued)

(58) Field of Classification Search
    CPC ........ B27G 13/00; B32D 61/00; B27B 33/00; C23C 28/044; C23C 28/42; C23C 28/048; C23C 28/042; B23D 65/00; B23D 61/028; Y10T 428/24355
    See application file for complete search history.

(56) References Cited

U.S. PATENT DOCUMENTS

| | | | |
|---|---|---|---|
| 6,730,392 B2 * | 5/2004 | Vetter | ............... C23C 28/044 428/216 |
| 2007/0160869 A1 * | 7/2007 | Jonsson | ............... C23C 14/588 428/689 |

(Continued)

FOREIGN PATENT DOCUMENTS

| | | |
|---|---|---|
| EP | 2 037 004 A1 | 3/2009 |
| JP | 2-252501 A | 10/1990 |

(Continued)

OTHER PUBLICATIONS

STIC Translation of JP 2004344991 (Year: 2017).*

*Primary Examiner* — Frank J Vineis
*Assistant Examiner* — Michael Zhang
(74) *Attorney, Agent, or Firm* — Norton Rose Fulbright US LLP

(57) ABSTRACT

A wood or resin cutting tool with improved durability is provided. The wood or resin cutting tool is composed of a base material made of steel or a cemented carbide alloy, and a coating formed on at least one of the rake face and the clearance face of the cutting tool. The coating includes a periodic structure layer made of chromium oxynitride, in which high oxygen regions having a high concentration of oxygen in the texture and low oxygen regions having a lower concentration of oxygen in the texture than the high oxygen regions periodically exist in the thickness direction of the coating. The periodic structure layer is formed such that the nitrogen concentration periodically turns high and low in the thickness direction of the layer corresponding to the high oxygen regions and the low oxygen regions.

2 Claims, 6 Drawing Sheets

(51) Int. Cl.

| | |
|---|---|
| *B23D 61/00* | (2006.01) |
| *B23D 61/02* | (2006.01) |
| *B23D 65/00* | (2006.01) |
| *C23C 14/06* | (2006.01) |
| *C23C 28/04* | (2006.01) |
| *C23C 28/00* | (2006.01) |

(52) U.S. Cl.
CPC .......... *B27B 33/00* (2013.01); *C23C 14/0676* (2013.01); *C23C 28/042* (2013.01); *C23C 28/044* (2013.01); *C23C 28/048* (2013.01); *C23C 28/42* (2013.01); *Y10T 428/24355* (2015.01)

(56) References Cited

U.S. PATENT DOCUMENTS

| | | | |
|---|---|---|---|
| 2007/0292671 A1* | 12/2007 | Akesson | C22C 29/08 428/216 |
| 2009/0053491 A1* | 2/2009 | Loboda | H01L 21/02126 428/216 |
| 2009/0120241 A1* | 5/2009 | Vetter | C23C 14/025 76/115 |
| 2010/0215950 A1* | 8/2010 | Schultz | C03C 17/225 428/336 |
| 2011/0033722 A1* | 2/2011 | Minami | B23D 61/00 428/553 |

FOREIGN PATENT DOCUMENTS

| | | | |
|---|---|---|---|
| JP | 2002-103304 A | | 4/2002 |
| JP | 2004344991 A | * | 12/2004 |
| JP | 2007-290180 A | | 11/2007 |
| WO | WO 2009/131159 A | | 10/2009 |

\* cited by examiner

CUTTING TOOL

TECHNICAL FIELD

The present invention relates to a wood or resin cutting tool composed of a base material made of steel or a cemented carbide alloy, and a coating formed an at least one of the rake face and the clearance face of the cutting tool.

BACKGROUND ART

For example, attempts have been made to improve wear resistance of wood cutting tools by forming a hard coating that is made of a chromium nitride on either the rake face or the clearance face of the cutting tool, as described in Patent Document 1. A hard coating that is made of a chromium nitride provides wear resistance that cannot be achieved by a base material, such as tool steel, alone. When used to cut wood that has a high consent of water, however, the chromium component is likely to elute, and the desired durability may not be achieved due to corrosion. Thus, a wood cutting tool coated with a base coating that is made of chromium or a chromium nitride and a main coating of a chromium oxide that is applied on the base coating, has been proposed, like the wood cutting tool described in Patent Document 2.

RELATED ART DOCUMENTS

Patent Documents

Patent Document 1: Japanese Unexamined Patent Application Publication No. 02-252501
Patent Document 2: WO 2009/131159

DISCLOSURE OF THE INVENTION

Problems to be Solved by the Invention

With the above-described main coating made of a chromium oxide, the chromium component is unlikely to elute when used to cut wood that has a high content of water, and thus the main coating is superior in corrosion resistance. The main coating, however, is inferior to the base coating, which is made of a chromium nitride, in properties such as toughness and adhesion, and is likely to chip. Thus, there has been a need for improvement in durability of a cutting tool as a whole.

The present invention has been proposed to suitably solve the above-described problem in the related art, and has an object to provide a wood or resin cutting tool that has superior durability.

Means of Solving the Problems

To overcome the problem and to achieve the object, the gist of the cutting tool of the invention according to claim 1 of the present application is a wood or resin cutting tool composed of a base material made of steel or a cemented carbide alloy, and a coating formed on at least one of the rake face and the clearance face of the cutting tool, wherein the coating includes a periodic structure layer static of chromium oxynitride in which high oxygen regions having a high concentration of oxygen in the texture and low oxygen regions having a lower concentration of oxygen in the texture than the high oxygen regions periodically exist in the thickness direction of the coating.

According to the invention of claim 1 the periodic structure layer improves toughness and adhesion of the coating compared to a layer of a chromium oxide alone, and also improves, corrosion resistance of the coating compared to a layer of a chromium nitride alone. With high oxygen regions having a high oxygen concentration, the periodic structure layer can prevent or reduce diffusion of atoms when the temperature increases. This, in turn, prevents oxidization and coarsening of crystal grains, thereby enabling refinement of the texture and enhancing heat resistance of the coating.

The gist of the invention according to claim 2 is that the low oxygen regions have a higher concentration of nitrogen in the texture than the high oxygen regions, and that the periodic structure layer has the nitrogen concentration that periodically turns high and low in the thickness direction, of the layer corresponding to the high oxygen regions and the low oxygen regions.

According to the invention of claim 2, the toughness, hardness, and strength of the coating are enhanced by striking a balance between nitrogen and oxygen in the entire texture of the periodic structure layer.

The gist of the invention is that a striped contrast that is observable by a transmission electron microscope is created by the high oxygen regions and the low oxygen regions in a sectional texture of the periodic structure layer.

According to the invention, because the high oxygen regions and the low oxygen regions are observable as a striped contrast by the transmission electron microscope, the quality can be easily checked.

The gist of the invention is that the high oxygen regions and the low oxygen regions are formed to exist at a period of 1 nm to 150 nm.

The invention efficiently forms the periodic structure layer.

The gist of the invention is that the periodic structure layer having an entire composition including the high oxygen regions and the low oxygen regions is composed of chromium oxynitride represented by $(Cr_{1-a}X_a)N_{1-b}O_{b+}$ wherein X includes at least one element selected from the group of B, C, Al, Si, Ti, V, Ni, Cu, Y, Zr, Nb. Mo, Ta, and W, and $0 \leq a \leq 0.5$ and $0 < b < 0.6$.

According to the invention, increased hardness of the coating and refining of the texture can be achieved, and wear resistance and strength, for example, may be further enhanced, by adding an element represented by X. By adjusting elements to be added according to the work material, the service life of the cutting tool may be further prolonged.

Effects of the Invention

In the cutting tool according to the present inversion, the periodic structure layer has the advantages of both a chromium nitride and a chromium oxide, and thus the durability of the cutting tool is former enhanced.

BRIEF DESCRIPTION OF THE DRAWINGS

FIG. 4A shows Example 1, FIG. 4B shows Comparative Example 1, and FIG. 4C shows Comparative Example 2;

MODE FOR CARRYING OUT THE INVENTION

Figure 1:
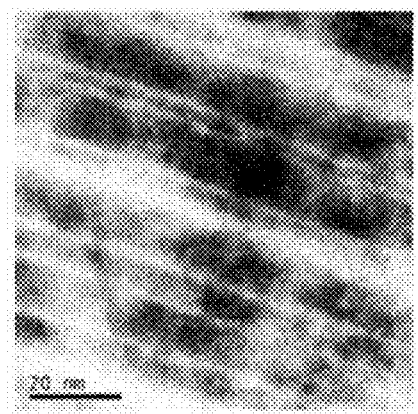
FIG. 1 is a photograph of a sectional texture of the periodic structure layer according to the present invention, observed by a transmission electron microscope.

The cutting tool according to the present invention is composed of a base material made of steel, such as tool steel, cutting steel, hearing steel or stainless steel, or a cemented carbide alloy either alone or in combination, and a coating is formed on at least one of the rake face and the clearance face of the cutting tool. That is, the durability of the cutting edge of the wood cutting tool is improved by forming a coating on at least one of the rake face and the clearance face or on both the rake face and the clearance face of the cutting tool. In such a cutting tool, for example, the coating applied on the clearance face of the base material may be removed by, for example, grinding daring sharpening, so that a section of the coating is left only on the tip of the cutting edge of the clearance face, but not across the entire clearance face in the form of a layer. The present invention may be applicable to cutting tools including flat-blade knives such as planar knives, cutters, tipped saw blades, router bits, knives, hollow chisels, and their replaceable blades, and is suitably used for processes including cutting wood, resin, and the like. Cermet may be used as a base material.

The above-described coating includes at least a periodic structure layer made of chromium oxynitride in which high oxygen regions having a high concentration of oxygen in the texture and low oxygen regions having a low concentration of oxygen in the texture periodically exist. The coating may be formed as a group of the periodic structure layer alone, a laminated plurality of groups of the periodic structure layers, or a combination of the periodic structure layer and another layer made of a metal composition different from the periodic structure layer. The coating is formed to have an entire thickness in the range of around 0.2 μm to 15 μm. If the coating has a thickness of less than 0.2 μm, the protecting effect for the base material would not be achieved, and if the coating has a thickness greater than 15 μm, problematic chipping would likely to occur. Examples of other layers that may be used in combination with the periodic structure layer include at least one layer selected, for example, from a metal, a nitride, a carbide, a carbonitride, and an oxide including at least one element such as chromium, titanium, and aluminium. A metal layer as used in the present invention indicates a layer that shows a peak of a metal and/or an alloy in X-ray diffraction, and the metal layer may include a slight amount of nitrogen and/or oxygen. A nitride layer as used in the present invention indicates a layer that shows a peak of a nitride in X-ray diffraction, and the nitride layer may include a slight amount of oxygen in the texture. An oxide layer as used in the present invention indicates a layer that shows a peak of an oxide in X-ray diffraction, and the oxide layer may include a slight amount of nitrogen in the texture. The periodic structure layer may be exposed on the surface of the coating or covered with another layer. In the coating, the periodic structure layers and other layers may be alternately laminated, or the periodic structure layers may be interposed between every required number of other layers. How the periodic structure layers are laminated with other layers is not particularly limited.

The periodic structure layer is made of chromium oxynitride in which high oxygen regions having a high concentration of oxygen in the texture and low oxygen regions having a lower concentration of oxygen in the texture than the high oxygen regions periodically exist in the thickness direction of the coating (the periodic structure layer). The periodic structure layer is a substance in which a texture of a single layer of chromium oxynitride composing the periodic structure layer has periodic concentration difference of oxygen, and is not laminated substances of layers of chromium oxynitride in which the oxygen concentration is set high and layers of chromium oxynitride in which the oxygen concentration is set low. The periodic structure layer is formed such that high, oxygen regions and low oxygen regions occur at a period of 1 nm to 150 nm. This range of periodicity allows practically (industrially) efficient formation of the periodic structure layer. For an experiment, it is possible to form a periodic structure layer in which high oxygen regions and low oxygen regions occur with a period outside the above-described range. In the periodic structure layer, the high oxygen regions are arranged at intervals of 1 nm to 150 nm in the thickness direction of the periodic structure layer, leaving the width of the low oxygen regions, which are interposed between adjacent high oxygen regions, in the range of 1 nm to 150 nm. Likewise, in the periodic structure layer, the low oxygen regions exist at intervals of 1 nm to 150 nm in the thickness direction of the periodic structure layer, leaving the width of the high oxygen regions, which are interposed between adjacent low oxygen regions, in the range of 1 nm to 150 nm. The high oxygen regions and the low oxygen regions may exist at approximately identical intervals or at irregular intervals within the above-described range of the period. That is, the term "period" as used in the present invention does not limit the repeating intervals of the high oxygen regions and the low oxygen regions to be constant, but instead indicates that the intervals between the high oxygen regions and the low oxygen regions may vary within a predetermined range.

The periodic structure layer has a higher toughness and adhesion than a layer made of a chromium oxide alone, and has superior corrosion resistance to a layer made of a chromium nitride alone. With high oxygen regions having a high oxygen concentration, the periodic structure layer can prevent or reduce diffusion of atoms when the temperature increases. This, in turn, prevents oxidization and coarsening of crystal grains, thereby enabling refinement of the texture, and enhancing heat resistance of the coating.

The entire composition of the periodic structure layer including the high oxygen regions and the low oxygen regions is represented by the formula $(Cr_{1-a}X_a)N_{1-b}O_b$ ($0 \leq a \leq 0.5$ and $0 < b < 0.6$). The periodic structure layer includes, as X, at least one element or a combination of elements selected from B (boron), C (carbon), Al (aluminium), Si (silicon), Ti (titanium), V (vanadium), Ni (nickel), Cu (copper), Y (yttrium), Zr (zirconium), Nb (niobium), Mo (molybdenum), Ta (tantalum), and W (tungsten), or may not include any of these elements (a=0). Here, when a is greater than 0.5 (a>0.5), the periodic structure layer would lose preferable corrosion resistance and toughness, which are characteristic of chromium oxynitride. When oxygen is equal to or greater than 0.6 (b≥0.6), the result would be an oxide as defined in the present invention, having a peak of an oxide in X-ray diffraction, failing to achieve preferable durability provided by the periodic structure layer made of chromium oxynitride having the above-described texture structure (periodic structure). When the periodic structure layer contains no oxygen (b=0) the result would be a mere nitride having no periodic structure, failing to achieve preferable durability provided by the periodic structure layer made of chromium oxynitride having the above-described periodic structure. By adding the above-described element(s) represented by X to the periodic structure layer, the coating may be harder and the texture may be finer, allowing further improvement in wear resistance and strength, for example. By adjusting the elements to be added depending on the work material, the service life of the cutting tool may be further prolonged.

The periodic structure layer has a higher nitrogen concentration in the texture in the low oxygen regions than the high oxygen regions, and thus the relationship between the nitrogen concentration and the oxygen concentration in the texture is opposite between the high oxygen regions and the low oxygen regions. Specifically the nitrogen concentration in the periodic structure layer periodically turns high and low in the thickness direction of the layer corresponding to the high oxygen regions and the low oxygen regions. The high oxygen regions have a relatively high oxygen concentration and a relatively low nitrogen concentration in the texture, whereas the low oxygen regions have a relatively low oxygen concentration and a relatively high nitrogen concentration in the texture. That is, there is a balance between nitrogen and oxygen in the whole texture of the periodic structure layer. This allows further enhancement in toughness, hardness, and strength.

As described above, the periodic structure layer includes alternating high oxygen regions extending in a direction intersecting the thickness direction of the layer and low oxygen, regions similarly extending in a direction intersecting the thickness direction of the layer. When the sectional texture of the periodic structure layer is observed by a transmission electron microscope, the high oxygen regions and the low oxygen regions appear as a striped contrast as shown in FIG. 1. FIG. 1 is a photograph (bright field image), taken by the transmission electron microscope, of the sectional texture of the periodic structure layer made of chromium oxynitride, whose entire composition is represented by $Cr_{0.45}N_{0.27}O_{0.28}$. FIG. 1 is an example of a periodic structure layer formed by rotating a table 22 at 2 rpm in the deposition apparatus of the Examples described below. In the periodic structure layer of FIG. 1, the high oxygen regions have light colors and the low oxygen regions have deep colors, and the high oxygen regions and the low oxygen regions periodically exist in the thickness direction (the vertical direction in FIG. 1). This is observed as a striped contrast constituted by the high oxygen regions and the low oxygen regions. That is, in the periodic structure layer according to the present invention, it can be said that a striped contrast, which is observable by the transmission electron microscope, is formed by the high oxygen regions and the low oxygen regions in its sectional texture. In this manner, as the high oxygen regions and the low oxygen regions are observable as a striped contrast by the transmission electron microscope, the qualify can be easily checked. Whether the concentrations of chromium, oxygen, and nitrogen in the periodic structure layer are high or low, is identified by comparison with the results of EDS (energy dispersive X-ray spectroscopic analysis) mapping.

Figure 2:
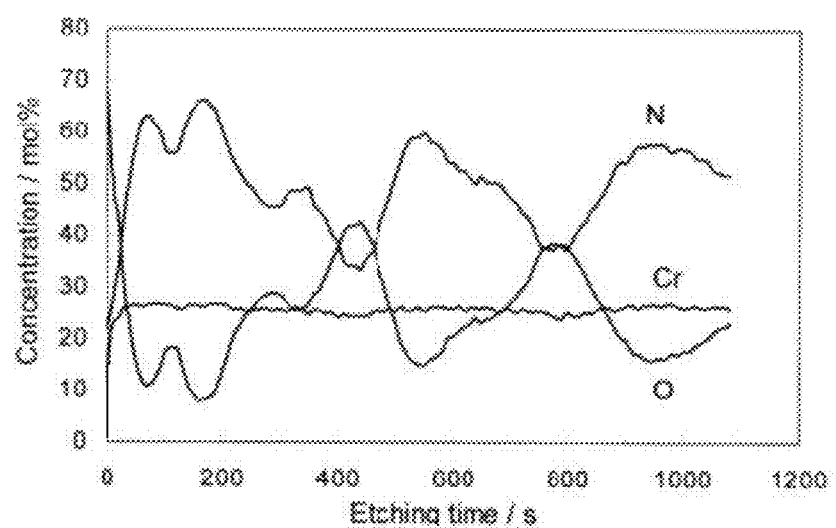
FIG. 2 is a graph showing the results of the analysis by Auger electron spectroscopy apparatus of the periodic structure layer according to the present invention.

FIG. 2 is a graph showing the results of an analysis, by Auger electron spectroscopy apparatus, of the same periodic structure layer as FIG. 1 in the depth direction (corresponding to the thickness direction of the periodic structure layer), during the sputtering of the surface of the periodic structure layer. In FIG. 2, the vertical axis indicates the concentrations of chromium (Cr), nitrogen (N), and oxygen (O), and the horizontal axis indicates the etching time. The etching time may be regarded as replaceable with the depth from the surface of the periodic structure layer, and thus it is understood that the nitrogen concentration and the oxygen concentration repeatedly rise and fall in the opposite manner to each other in the thickness direction of the periodic structure layer. What FIG. 2 shows clearly accords with the results of observation in FIG. 1, in which the high oxygen regions having a high oxygen concentration and the low oxygen regions having a low oxygen concentration periodically appear in the thickness direction of the periodic structure layer.

An example of a method of making a periodic structure layer according to the present invention will be briefly described. The periodic structure layer may be formed by PVD (physical vapor deposition). Of PVD methods, an arc ion plating method is suitable. The periodic structure layer may be formed, for example, by relatively displacing a base material, to which a coating is to be applied, relative to a chromium evaporation source, or specifically, moving the base material closer to or away from the chromium evaporation source, during a PVD process in a chamber into which oxygen and nitrogen have been introduced, so that low oxygen regions are preferentially formed when the base material moves closer to the evaporation source, and high oxygen regions are preferentially formed when the base material moves away from the evaporation source. Additionally, the ratio of oxygen to nitrogen, may vary over the PVD process in a chamber containing oxygen and nitrogen so that the periodic structure layer or a layer with no periodic structure (e.g., metal, a nitride or an oxide) can be selectively formed. In this manner, a periodic structure layer according to the present invention and another layer may be easily formed in one-batch PVD process by controlling the relative positional relationship of the base material with the evaporation source, and the ratio of oxygen to nitrogen.

Next, a wood cutting tool according to the present invention will be described below in the following Examples.

EXAMPLE

Figure 3:
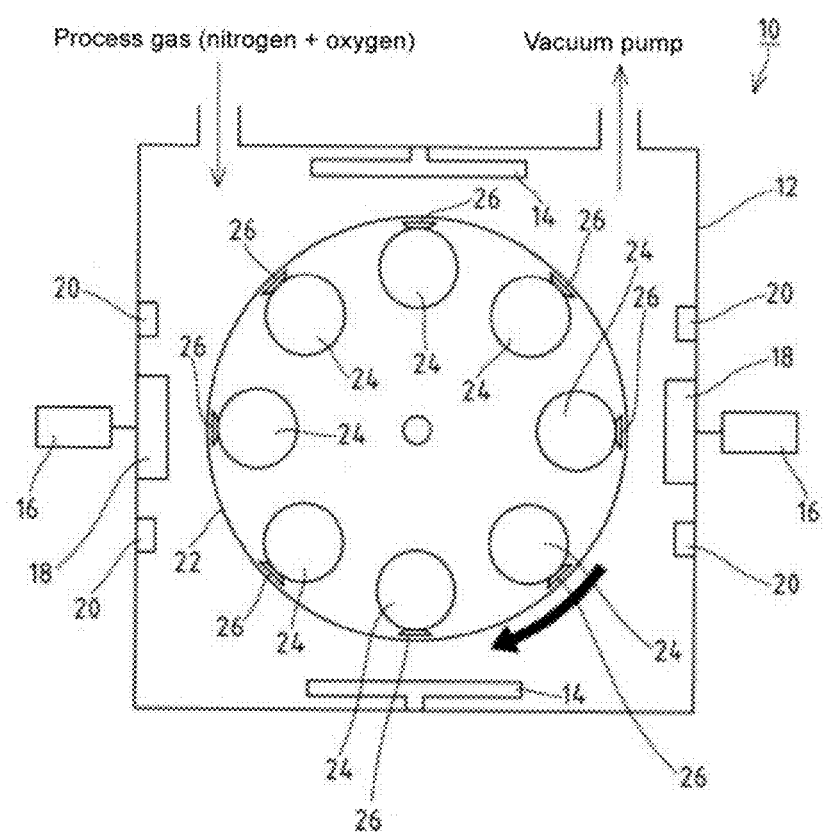
FIG. 3 is a view schematically illustrating the deposition apparatus used in Examples.

In the Examples, a coating is formed using an arc ion plating apparatus (hereinafter simply referred to as "the deposition apparatus") 10 as shown in FIG. 3. In the deposition apparatus 10, a process gas containing nitrogen and oxygen is supplied to a chamber 12 heated with a heater 14. The chamber 12 includes chromium cathodes 18, which are connected to an arc power source 16 and serve as an evaporation source, and anodes 20, which are provided on both sides of the respective cathodes 18. The chamber 12 also includes a table 22, which rotates around its vertical axis. Base material holders 24 are provided on the table 22, and to one side of each base material holder, a base material 26 is attached. The deposition apparatus 10 is configured to form a required coating on the base materials 26 by arc discharge while rotating the table 22 to the chamber 12, into which nitrogen and oxygen have been introduced at a predetermined concentration. Specifically, in the periodic structure layer (Cr—N—O) of the Examples, when the base material 26 moves closer to the cathodes 18 along with the rotation of the table 22, low oxygen regions are preferentially formed, and when the base materials 26 move away from the cathode 18 along with the rotation of the table 22, high oxygen regions are preferentially formed. That is, the periods of the high oxygen regions and the low oxygen regions can be controlled to some extent by the rotation of the table 22. In the deposition apparatus 10, a layer made of a chromium oxide (Cr—O) may be formed by increasing the oxygen concentration in the process gas, and a layer made of a chromium nitride (Cr—N) may be formed by increasing the nitrogen concentration in the process gas. Additionally, the base material holders 24 may be rotated on its vertical axis relative to the table 22, so that the base material holders 24 themselves rotate while the table 22 rotates.

Figure 4A:
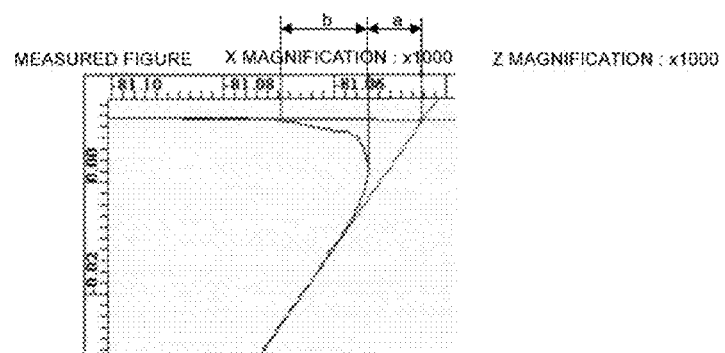
FIGS. 4A to 4C are views showing a cross section of the cutting edge after Experiment 1, and specifically.
Figure 4B:
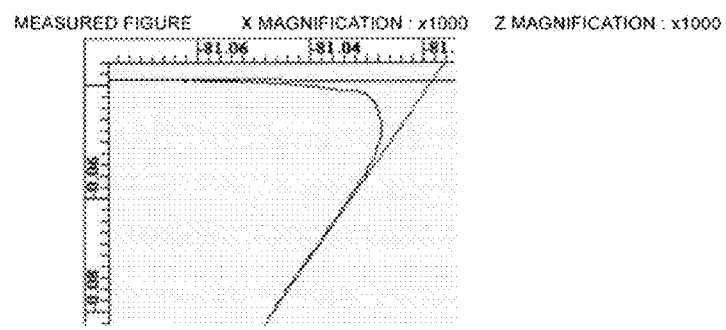
Figure 4C:
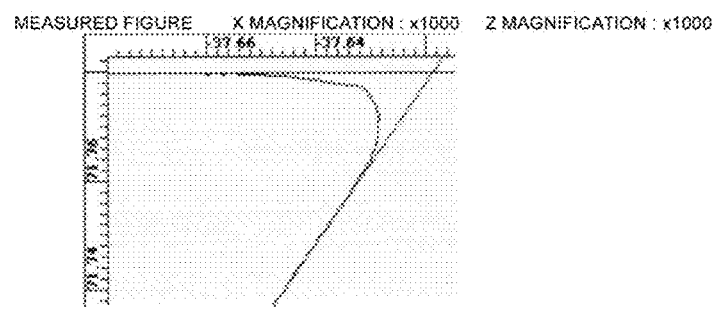
Figure 5:
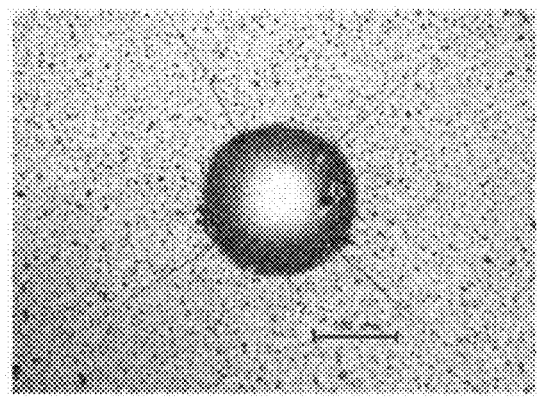
FIG. 5 is a photograph showing the indentation produced on the coating of Example 2 in a Rockwell hardness test.
Figure 6:
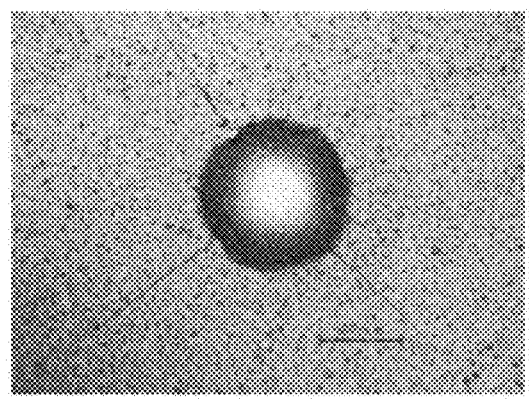
FIG. 6 is a photograph showing the indentation produced on the coating of Example 3 in a Rockwell hardness test.
Figure 7:
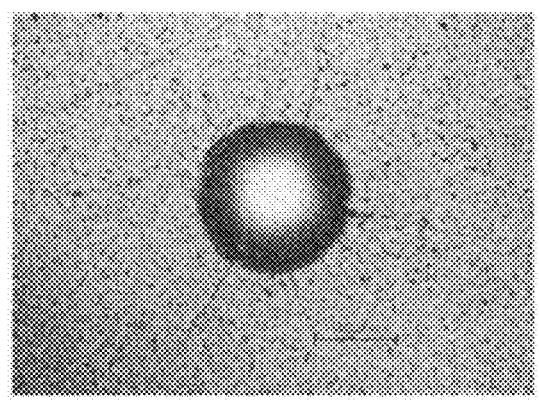
FIG. 7 is a photograph showing the indentation produced on the coating of Example 4 in a Rockwell hardness test.
Figure 8:
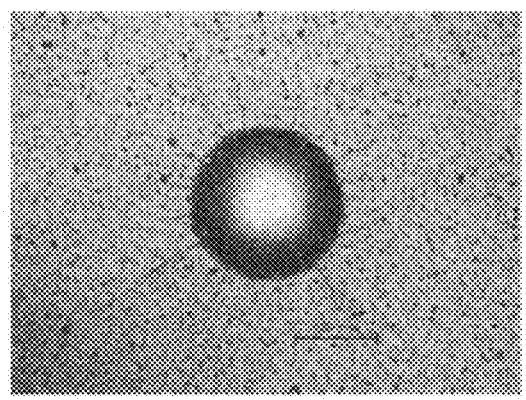
FIG. 8 is a photograph showing the indentation produced on the coating of Example 5 in a Rockwell hardness test.
Figure 9:
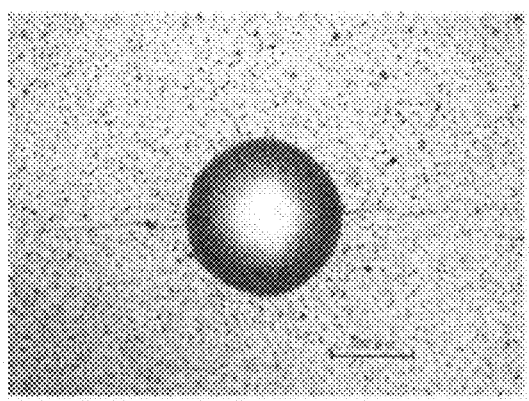
FIG. 9 is a photograph showing the indentation produced on the coating of Comparative Example 3 in a Rockwell hardness test.

Using the deposition apparatus 10, coatings were formed on the base materials 26, and Examples, in each of which a coating including the periodic structure layer according to the present invention is formed on the rake face, and Comparative Examples, in each of which a coating that does not include the periodic structure layer according to the present invention is formed on the rake face were obtained. In the following experiments, wood was cut using the wood cutting tools of Examples and Comparative Examples, and the amount of recession of the rake face and the wear land width on the rake face of each example were determined. Here, the amount of recession of the rake face is a measure of how much the cutting edge after cutting has bees regressed in comparison to the cutting edge before the cutting (the edge created by the rake face and the clearance face) (see a in FIG. 4A), and it can be said that the smaller the amount of recession of the rake face, the higher the durability of the coating. The wear land width on the rake face is a measure of how much the rake face is worn after cutting in comparison to the rake face before the cutting. This is represented by the width of a portion having been worn in the cutting edge alter cutting (see b in FIG. 4A), and it can be said that the smaller the wear land width on the rake face, the higher the durability of the coating. Under the conditions shown in Tables 3 to 6, the layer recited above in the column "Layer structure of coating" is provided on the side of the base material in the coating, and the layer recited below is provided on the side of the surface in the coating. "Presence of periodic structure" indicates whether the layer made of chromium oxynitride (Cr—N—O) has the structure in which the high oxygen regions and the low oxygen regions periodically exist. "Number of rotations" indicates the number of rotations of the table 22 during the formation of the periodic structure layers of the Examples in the deposition apparatus 10, and "Oxygen concentration" indicates the oxygen concentration in a mixed gas of nitrogen and oxygen in the chamber 12 during the formation of the periodic structure layers of the Examples in the deposition apparatus 10. The layers that are made of a chromium oxide and formed in Examples and Comparative Examples are made of dichromium trioxide ($Cr_2O_3$).

Experiment 1

In Experiment 1, carbide replaceable blades for a router bit, each composed of a base material, that is made of a cemented carbide alloy and coated with a coating prepared as indicated in Table 1, were formed. In an NC router, wet hinoki (Japanese cypress) (water content: 40% to 60%) was cut using a router bit (cutting edge diameter: 45 mm) to which the respective carbide replaceable blades were attached. The number of rotations of the router bit was 6000 rpm, and the work piece material was fed at a speed of 1 m/min and cut for the distance of 15 m, with the router bit cutting into the work piece material to a depth of 20 mm. After the cutting, the amount of recession of the rake face and the wear land width on the rake face were measured for each blade. Table 1 shows the results.

TABLE 1

|  | Layer structure of coating | Thickness of coating ($\propto$m) | Presence of periodic structure | Number of rotations (rpm) | Oxygen concentration (%) | Amount of recession of rake face ($\propto$m) | Wear land width on rake face ($\propto$m) |
| --- | --- | --- | --- | --- | --- | --- | --- |
| Example 1 | Cr—N—O | 2.5 | Yes | 2.0 | 20 | 9.5 | 22.5 |
| Comparative Example 1 | Cr—N | 2.5 | — | — | — | 10.0 | 29.0 |
| Comparative Example 2 | Cr—N—O | 2.5 | No | — | 20 | 10.0 | 25.5 |

The results shown in Table 1 demonstrate the following: Example 1 and Comparative Example 2, which have a coating of chromium oxynitride, make wear land width on the rake face better, and seemingly reduced elution of chromium in cutting wet hinoki (Japanese cypress) in comparison to Comparative Example 1, which has a coating of a chromium nitride. Example 1, which has a periodic structure composed of high oxygen regions and low oxygen regions, is improved in terms of the amount of recession of the rake face and the wear land width on the rake face in comparison to Comparative Example 2, which does not have such a periodic structure. A layer of chromium oxynitride having a periodic structure exhibits improved wear resistance and corrosion resistance.

Experiment 2

In Experiment 2, carbide replaceable blades for a router bit, each composed of a base material that is made of a cemented carbide alloy and coated with a coating prepared as indicated in Table 2, were formed. In an NC router, *Pinus sylvestris* laminated wood was cut using a router bit (cutting edge diameter: 45 mm) to which the respective carbide replaceable blades were attached. The number of rotations of the router bit was 6000 rpm, and the work piece material was fed at a speed of 1 m/min and cut for the distance of 45 m, with the router bit cutting into the work piece material to a depth of 20 mm. After the cutting, the amount of recession of the rake face and the wear land width in the rake face were measured for each blade. Table 2 shows the results.

TABLE 2

|  | Layer structure of coating | Thickness of coating ($\propto$m) | Presence of periodic structure | Number of rotations (rpm) | Oxygen concentration (%) | Amount of recession of rake face ($\propto$m) | Wear land width on rake face ($\propto$m) |
|---|---|---|---|---|---|---|---|
| Example 2 | Cr—N—O | 2.5 | Yes | 0.5 | 20 | 12.5 | 5.5 |
| Example 3 | Cr—N—O | 2.5 | Yes | 1.0 | 20 | 13.0 | 4.5 |
| Example 4 | Cr—N—O | 2.5 | Yes | 2.0 | 20 | 13.5 | 5.5 |
| Example 5 | Cr—N—O | 2.5 | Yes | 4.0 | 20 | 13.5 | 4.0 |
| Comparative Example 3 | Cr—N | 2.5 | — | — | — | 15.0 | 11.0 |
| Comparative Example 4 | Cr—N—O | 2.5 | No | — | 20 | 14.0 | 7.5 |

The results shown in Table 2 demonstrate the following: Examples 2 to 5, each of which has a periodic structure layer made of chromium oxynitride, are improved in terms of the amount of recession of the rake face and the wear land width on the rake face in comparison to Comparative Example 3, which has a coating of a chromium nitride. Examples 2 to 5, each of which has a periodic structure composed of high oxygen regions and low oxygen regions, are improved in terms of the wear land width on the rake face in comparison to Comparative Example 4, which does not have such a periodic structure. A layer of chromium oxynitride having a periodic structure exhibits improved wear resistance and corrosion resistance. Furthermore, although the periods created by high oxygen regions and low oxygen regions vary depending on the number of rotations of table 22, as demonstrated by Examples 2 to 5, the differences in periodicity do not significantly affect the amount of recession of the rake face and the wear land width on the rake face.

Experiment 3

In Experiment 3, cutter knives, each composed of a base material that is made of high speed tool steel (SKH51) and coated with a coating prepared as indicated in Table 3, were formed. In an NC processing machine, spruce was cut using cutters (cutting edge diameter: 125 mm) to which the respective knives were attached. The number of rotations of the cutters was 6000 rpm, and the work piece material was fed at a speed of 5 m/min and cut for the distance of 1000 m, with each cutter knife cutting into the work piece material to a depth of 0.5 mm. After the cutting, the amount of recession of the rake face and the wear land width on the rake face were measured for each knife. Table 3 shows the results.

TABLE 3

|  | Layer structure of coating | Thickness of coating ($\propto$m) | Presence of periodic structure | Number of rotations (rpm) | Oxygen concentration (%) | Amount of recession of rake face ($\propto$m) | Wear land width on rake face ($\propto$m) |
|---|---|---|---|---|---|---|---|
| Example 6 | Cr—N (Four layers) | 2 | Yes | 0.5 | 20 | 5.8 | 3.0 |
|  | Cr—N—O (One layer) | 1 |  |  |  |  |  |
| Example 7 | Cr—N (Four layers) | 2 | Yes | 1.0 | 20 | 5.4 | 2.8 |
|  | Cr—N—O (One layer) | 1 |  |  |  |  |  |
| Example 8 | Cr—N (Four layers) | 2 | Yes | 2.0 | 20 | 5.8 | 3.0 |
|  | Cr—N—O (One layer) | 1 |  |  |  |  |  |
| Example 9 | Cr—N (Four layers) | 2 | Yes | 4.0 | 20 | 5.5 | 3.1 |
|  | Cr—N—O (One layer) | 1 |  |  |  |  |  |
| Comparative Example 5 | Cr—N (Five layers) | 3 | — | — | — | 8.9 | 4.3 |
| Comparative Example 6 | Cr—N (Four layers) | 2 | No | — | 20 | 6.5 | 3.6 |
|  | Cr—N—O (One layer) | 1 |  |  |  |  |  |

The results shown in Table 3 demonstrate the following: Examples 6 to 9, which have a coating with a periodic structure layer of chromium oxynitride, are improved in terms of the amount of recession of the rake face and the wear land width on the rake face in comparison to Comparative Example 5, which has a coating of a chromium nitride. Examples 6 to 9, which have a periodic structure composed of high oxygen regions and low oxygen regions, are improved in terms of the amount of recession of the rake face and wear land width on the rake face in comparison to Comparative Example 6, which does not have such a periodic structure. A layer of chromium oxynitride having a periodic structure exhibits improved wear resistance and corrosion resistance. Furthermore, although the periods created by the high oxygen regions and the low oxygen regions vary depending on the number of rotations of table 22, as demonstrated by Examples 6 to 9, the differences in periodicity do not significantly affect the amount of recession of the rake face and the wear land width on the rake face.

The results shown in Table 4 demonstrate the following: Examples 10 to 11, which have a coating with a periodic structure layer of chromium oxynitride, are improved in terms of the amount of recession of the rake face and the wear land width on the rake face compared with Comparative Example 7, which has a coating of a chromium nitride. Examples 10 to 11, which have a periodic structure composed of high oxygen, regions and low oxygen regions, are improved in terms of the amount of recession of the rake face compared with Comparative Example 8, which does not have such a periodic structure. A layer of chromium oxynitride having a periodic structure exhibits improved wear resistance and corrosion resistance. Furthermore, as Example 11 demonstrates, the wear land width on the rake face is improved by forming a layer of a chromium oxide on the outermost surface of the coating, as compared to a coating having a periodic structure layer exposed on the outermost surface.

Experiment 4

In Experiment 4, carbide replaceable blades for a router bit, each composed of a base material that is made of a cemented carbide alloy and coated with a coating prepared as indicated in Table 4, were formed. In an NC router, spruce laminated wood was cut using a rooter bit (cutting edge diameter: 45 mm) to which the respective carbide replaceable blades were attached. The number of rotations of the router bit was 6000 rpm, and the work piece material was fed at a speed of 1 m/min and cut for the distance of 90 m, with each router bit cutting into the work piece material to a depth of 0.5 mm. After the cutting, the amount of recession of the rake face and the wear land width on the rake face were measured for each blade. Table 4 shows the results.

Experiment 5

In Experiment 5, carbide replaceable blades for a router bit, each composed of a base material that is made of a cemented carbide alloy and coated with a coating prepared as indicated in Table 5, were formed. In an NC router, Pinus sylvestris laminated wood was cut using a router bit (cutting edge diameter: 45 mm) to which the respective carbide replaceable blades were attached. The number of rotations of the router bit was 6000 rpm, and the work piece material was fed at a speed of 1 m/min and cut for the distance of 120 m, with each router bit cutting into the work piece material to a depth of 20 mm. After the cutting, the amount of recession of the rake face and the wear land width on the rake face were measured for each blade. Table 5 shows the results.

TABLE 4

|  | Layer structure of coating | Thickness of coating ($\propto$m) | Presence of periodic structure | Number of rotations (rpm) | Oxygen concentration (%) | Amount of recession of rake face ($\propto$m) | Wear land width on rake face ($\propto$m) |
|---|---|---|---|---|---|---|---|
| Example 10 | Cr—N (Four layers) | 6.0 | Yes | 1.0 | 20 | 9.0 | 4.0 |
|  | Cr—N—O (One layer) | 1.5 |  |  |  |  |  |
| Example 11 | Cr—N (Four layers) | 4.5 | Yes | 1.0 | 20 | 9.0 | 3.0 |
|  | Cr—N—O (One layer) | 1.5 |  |  |  |  |  |
|  | Cr—O (One layer) | 1.5 |  |  |  |  |  |
| Comparative Example 7 | Cr—N (Five layers) | 7.5 | — | — | — | 12.5 | 4.5 |
| Comparative Example 8 | Cr—N (Four layers) | 6.0 | No | — | 20 | 10.0 | 4.0 |
|  | Cr—N—O (One layer) | 1.5 |  |  |  |  |  |

TABLE 5

| | Layer structure of coating | Thickness of coating (∝m) | Presence of periodic structure | Number of rotations (rpm) | Oxygen concentration (%) | Amount of recession of rake face (∝m) | Wear land width on rake face (∝m) |
|---|---|---|---|---|---|---|---|
| Example 12 | Cr—N (Three layers) | 4.5 | Yes | 1.0 | 20 | 13.5 | 9.5 |
| | Cr—N—O (Two layers) | 3.0 | | | | | |
| Example 13 | {Cr—N(One layer) + Cr—N—O(One layer)} · 4 | {0.6 + 0.6} · 4 | Yes | 1.0 | 20 | 12.5 | 8.0 |
| | Cr—N (One layer) | 1.0 | | | | | |
| | Cr—N—O (One layer) | 1.0 | | | | | |
| | Cr—O (One layer) | 1.0 | | | | | |
| Example 14 | Cr—N (Two layers) | 2.5 | Yes | 1.0 | 20 | 12.0 | 8.0 |
| | Cr—N—O (One layer) | 1.0 | | | | | |
| | Cr—O (One layer) | 1.0 | | | | | |
| | Cr—N (One layer) | 1.0 | | | | | |
| | Cr—N—O (One layer) | 1.0 | | | | | |
| | Cr—O (One layer) | 1.0 | | | | | |
| Comparative Example 9 | Cr—N (Five layers) | 7.5 | — | — | — | 17.5 | 11.0 |
| Comparative Example 10 | Cr—N (Three layers) | 4.5 | No | — | 20 | 14.0 | 10.0 |
| | Cr—N—O (Two layers) | 3.0 | | | | | |

The results shown in Table 5 demonstrate the following: Examples 12 to 14, which have a coating with a periodic structure layer of chromium oxynitride, are improved in terms of the amount of recession of the rake face and the wear land width on the rake face in comparison to Comparative Example 9, which has a coating of a chromium nitride. Examples 12 to 14, which have a periodic structure composed of high oxygen regions and low oxygen regions, are improved in terms of the amount of recession of the rake face and the wear land width on the rake face in comparison to Comparative Example 10, which does not have such a periodic structure. A layer of chromium oxynitride having a period structure exhibits improved wear resistance and corrosion resistance. Furthermore, as Examples 13 and 14 demonstrate, by alternately laminating the periodic structure layers and other layers made of a chromium nitride, for example, the amount of recession of the rake face is improved in comparison to Example 12, which has no alternately laminated layers.

Experiment 6

In Experiment 6, carbide replaceable blades for a router bit, each composed of a base material that is made of a cemented carbide alloy and coated with a coating prepared as indicated in Table 6, were formed. In an NC router, Pinus sylvestris laminated wood was cut using a rooter bit (cutting edge diameter: 45 mm) attached with the respective carbide replaceable blades. The number of rotations of the router bit was 6000 rpm, and the work piece material was fed at a speed of 1 m/min and cut for the distance of 120 m, with each router bit cutting into the work piece material to a depth of 20 mm. After the cutting, the amount of recession of the rake face and the wear land width on the rake face were measured for each blade. Table 6 shows the results.

TABLE 6

| | Layer structure of coating | Thickness of coating (∝m) | Presence of periodic structure | Number of rotations (rpm) | Oxygen concentration (%) | Amount of recession of rake face (∝m) | Wear land width on rake face (∝m) |
|---|---|---|---|---|---|---|---|
| Example 15 | Cr—N (Four layers) | 6.0 | Yes | 1.0 | 20 | 14.0 | 9.0 |
| | Cr—N—O (One layer) | 1.5 | | | | | |
| Example 16 | Cr—N (Four layers) | 6.0 | Yes | 1.0 | 20 | 13.2 | 9.0 |
| | (Cr—B)—N—O (One layer) | 1.5 | | | | | |

TABLE 6-continued

|  | Layer structure of coating | Thickness of coating (μm) | Presence of periodic structure | Number of rotations (rpm) | Oxygen concentration (%) | Amount of recession of rake face (μm) | Wear land width on rake face (μm) |
|---|---|---|---|---|---|---|---|
| Example 17 | Cr—N (Four layers) | 6.0 | Yes | 1.0 | 20 | 13.5 | 9.5 |
|  | (Cr—Si)—N—O (One layer) | 1.5 |  |  |  |  |  |
| Example 18 | Cr—N (Four layers) | 6.0 | Yes | 1.0 | 20 | 13.8 | 9.5 |
|  | (Cr—Zr)—N—O (One layer) | 1.5 |  |  |  |  |  |
| Comparative Example 11 | Cr—N (Five layers) | 7.5 | — | — | — | 17.5 | 11.0 |
| Comparative Example 12 | Cr—N (Four layers) | 6.0 | No | — | 20 | 14.5 | 10.0 |
|  | Cr—N—O (One layer) | 1.5 |  |  |  |  |  |

The results shown, in Table 6 demonstrate the following: Examples 15 to 18, which have a coating with a periodic structure layer of chromium oxynitride, are improved in terms of the amount of recession of the rake face and the wear land width on the rake face compared with Comparative Example 11 which has a coating of a chromium nitride. Examples 15 to 18, which have a periodic structure composed of high oxygen regions and low oxygen regions, are improved in terms of the amount of recession of the rake face and wear land width on the rake face in comparison to Comparative Example 12, which does not have such a periodic structure. A layer of chromium oxynitride having a periodic structure exhibits improved wear resistance and corrosion resistance. Furthermore, as Examples 16 to 18 demonstrate, by adding another element in addition to chromium to the periodic structure layer, the amount of recession of the rake face or the wear land width on the rake face may be improved.

Experiment 7

Figure 10:
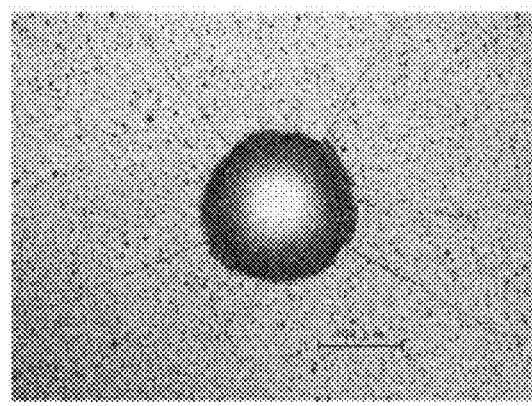
FIG. 10 is a photograph showing the indentation produced on the coating of Comparative Example 4 in a Rockwell hardness test.
Figure 11:
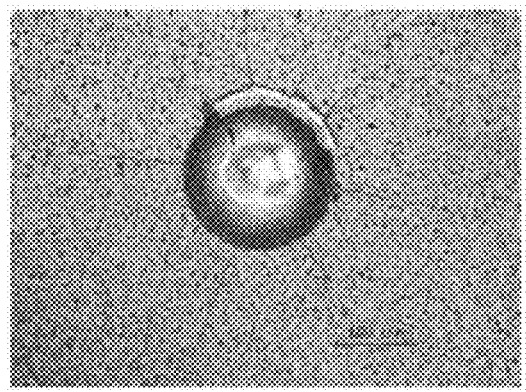
FIG. 11 is a photograph showing the indentation produced on the coating of Comparative Example 13 in a Rockwell hardness test.

In Experiment 7, the adhesion and toughness of the coatings (layers) were tested for the coatings of Examples 2 to 5 and Comparative Examples 3 to 4 shown in Table 2, by indentation formed in a Rockwell hardness test. Here, the adhesion and toughness of the coating (layer) were tested for Comparative Example 13 in which a coating made of a chromium oxide ($Cr_{0.388}N_{0.002}O_{0.61}$) and having a thickness of 2.5 μm was applied on the same base material as the base materials of Examples 2 to 5. A Rockwell indenter was pressed against the coating with a load of 60 kgf. The results are shown in FIGS. 5 to 11. As shown in FIGS. 5 to 8 and FIG. 10, the coatings of Examples 2 to 5 and Comparative Example 4, which are made of chromium oxynitride, have a very small area of destruction or peeling around the indentation compared with the coating of Comparative Example 13, which is made of a chromium oxide, as shown in FIG. 11. That is, the coatings of Examples 2 to 5, which are made of chromium oxynitride, exhibit significantly superior adhesion and toughness in comparison to the coating of Comparative Example 13, which is made of a chromium oxide. As shown m FIGS. 5 to 8, the coatings of Examples 2 to 5, which have a periodic structure composed of high oxygen regions and low oxygen regions, have a very small area of destruction or peeling around the indentation in comparison to the coating of Comparative Example 4, which is made of a chromium oxide, as shown in FIG. 10. That is, the coatings of Examples 2 to 5, which have a periodic structure composed of high oxygen regions and low oxygen regions, exhibits significantly superior adhesion, and toughness in comparison to the coating of Comparative Example 4, which has no periodic structure.

In this manner, the periodic structure layer has improved toughness and adhesion, compared with a layer made of a chromium oxide alone, and also has improved corrosion resistance compared with a layer made of a chromium nitride alone. As stated above, as the periodic structure layer has the advantages of both of a chromium nitride and a chromium oxide, the durability of a wood cutting tool can further be improved. Although the periodic structure is shown only at an oxygen concentration of 20% in Examples, the periodic structure has been confirmed at an oxygen concentration of 5% to 30%.

The invention claimed is:

1. A wood or resin cutting tool, comprising:
    a base material made of steel or a cemented carbide alloy and comprising a rake face and a clearance face; and
    a coating formed on at least the rake face of the base material, wherein the coating has a periodic structure layer consisting of only chromium oxynitride consisting of Cr, N and O, in which high oxygen regions having a a high concentration of oxygen and low oxygen regions having a lower concentration of oxygen than the high oxygen regions periodically exist in a thickness direction of the coating, and
    the high oxygen regions and the low oxygen regions are formed to exist at a period of 1 nm to 150 nm, and
    the periodic structure layer is a substance in which a texture of a single layer of chromium oxynitride composing the periodic structure layer has periodic concentration difference of oxygen and is not laminated substances of layers of chromium oxynitride in which the oxygen concentration is set high and layers of chromium oxynitride in which the oxygen concentration is set low.
2. The cutting tool according to claim 1, wherein
    the low oxygen regions have a higher concentration of nitrogen in the texture thereof than the high oxygen regions, and
    the periodic structure layer is formed such that the nitrogen concentration periodically turns high and low in the thickness direction corresponding to the high oxygen regions and the low oxygen regions.

* * * * *